(12) United States Patent
Mitani et al.

(10) Patent No.: US 8,982,656 B2
(45) Date of Patent: Mar. 17, 2015

(54) NON-VOLATILE SEMICONDUCTOR MEMORY DEVICE AND SEMICONDUCTOR DEVICE

(71) Applicant: Seiko Instruments Inc., Chiba (JP)

(72) Inventors: Makoto Mitani, Chiba (JP); Kotaro Watanabe, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 14/168,759

(22) Filed: Jan. 30, 2014

(65) Prior Publication Data
US 2014/0219037 A1  Aug. 7, 2014

(30) Foreign Application Priority Data
Feb. 1, 2013 (JP) .................. 2013-018757

(51) Int. Cl.
| | | |
|---|---|---|
| G11C 17/18 | (2006.01) | |
| G11C 29/02 | (2006.01) | |
| G11C 7/10 | (2006.01) | |
| G11C 7/22 | (2006.01) | |

(52) U.S. Cl.
CPC ............ *G11C 29/028* (2013.01); *G11C 7/1057* (2013.01); *G11C 7/106* (2013.01); *G11C 7/1066* (2013.01); *G11C 7/222* (2013.01); *G11C 29/021* (2013.01)
USPC ........................................ 365/225.7; 365/104

(58) Field of Classification Search
USPC .................... 365/225.7, 94, 96, 103, 104
See application file for complete search history.

(56) References Cited

U.S. PATENT DOCUMENTS

| 7,395,475 | B2* | 7/2008 | Do ................................ 714/734 |
|---|---|---|---|
| 8,391,091 | B2* | 3/2013 | Chang et al. .................. 365/201 |
| 2002/0034115 | A1* | 3/2002 | Jang et al. .................. 365/225.7 |
| 2010/0208531 | A1 | 8/2010 | Watanabe |
| 2010/0290302 | A1* | 11/2010 | Song et al. .................. 365/225.7 |

FOREIGN PATENT DOCUMENTS

JP  2010-192039 A  9/2010

\* cited by examiner

*Primary Examiner* — Harry W Byrne
*Assistant Examiner* — Lance Reidlinger
(74) *Attorney, Agent, or Firm* — Brinks Gilson & Lione

(57) ABSTRACT

Provided is a semiconductor non-volatile memory device capable of improving the accuracy of trimming by creating a written state before data is written into a non-volatile memory element. The semiconductor non-volatile memory device includes: a written data transmission circuit for transmitting written data to a non-volatile memory element; a first switch connected between the non-volatile memory element and a data output terminal; a third switch connected to an output terminal of the written data transmission circuit; and a control circuit for controlling the respective switches. When a test mode signal is input, the control circuit turns on only the first switch and the third switch so as to control the written data to be output to the data output terminal before data is written into the non-volatile memory element.

3 Claims, 8 Drawing Sheets

(a) TRANSMITTING DATA 1

(b) TRANSMITTING DATA 0

US 8,982,656 B2

NON-VOLATILE SEMICONDUCTOR MEMORY DEVICE AND SEMICONDUCTOR DEVICE

RELATED APPLICATIONS

This application claims priority under 35 U.S.C. §119 to Japanese Patent Application No. 2013-018757 filed on Feb. 1, 2013, the entire content of which is hereby incorporated by reference.

BACKGROUND OF THE INVENTION

1. Field of the Invention

The present invention relates to a non-volatile semiconductor memory device, and more particularly, to a test circuit for reading data of a non-volatile semiconductor memory element.

2. Description of the Related Art

FIG. 5 illustrates a related-art non-volatile memory element data write/read circuit. The related-art non-volatile memory element data write/read circuit includes a PMOS one-time programming (OTP) element 500 as an example of a non-volatile memory element. The PMOS OTP element 500 has a source terminal connected to a drain terminal of a PMOS transistor 530. The PMOS transistor 530 has a source terminal connected to a high voltage side power supply terminal VDD. A read circuit 510 includes a PMOS transistor 511, an NMOS transistor 512, and a latch 513. A data output terminal DOUT is connected to an input/output terminal of the latch 513, a drain terminal of the PMOS transistor 511, and a drain terminal of the NMOS transistor 512. The NMOS transistor 512 has a source terminal connected to a low voltage side power supply terminal VSS. The PMOS transistor 511 has a source terminal connected to a drain terminal of the PMOS OTP element 500. A write circuit 520 includes a PMOS transistor 521 and a written data transmission circuit 522.

The written data transmission circuit 522 has an output terminal WDATAX connected to a drain terminal of the PMOS transistor 521. The PMOS transistor 521 has a source terminal connected to the drain terminal of the PMOS OTP element 500. A control circuit 540 outputs a signal RENX, a signal WENX, a signal MEMX, and a signal CLR to a gate terminal of the PMOS transistor 511, a gate terminal of the PMOS transistor 521, a gate terminal of the PMOS transistor 530, and a gate terminal of the NMOS transistor 512, respectively, in accordance with a read mode signal φ1 or a write mode signal φ2 to be set.

Next, a description is given of the circuit operation.

(Writing of Data 1 into OTP Element)

FIG. 6A shows a timing chart of the respective signals in the case of writing data 1 into the PMOS OTP element 500. When a write mode is set, the write mode signal φ2 becomes "High". In a period of t<t1, the gate terminal RENX of the PMOS transistor 511 is level "High" and in the OFF state, the gate terminal CLR of the NMOS transistor 512 is level "Low" and in the OFF state, the gate terminal WENX of the PMOS transistor 521 is level "High" and in the OFF state, and the gate terminal MEMX of the PMOS transistor 530 is level "Low" and in the ON state. The output of the written data transmission circuit 522 is indefinite. In a period of t1<t<t2, the written data transmission circuit 522 outputs level "Low", and WDATAX becomes level "Low". In a period of t2<t<t3, WENX is set to level "Low" to turn on the PMOS transistor 521. In response thereto, level "Low" is transmitted to the drain terminal of the PMOS OTP element 500. In a period of t3<t<t4, by applying a write voltage VPP level to the VDD terminal, VPP is applied between the drain and source of the PMOS OTP element 500, to thereby write data 1. When data 1 is written, the PMOS OTP element 500 becomes a conductive state.

(Writing of Data 0 into OTP Element)

FIG. 6B shows a timing chart of the respective signals in the case of writing data 0 into the PMOS OTP element 500. When the write mode is set, the write mode signal φ2 becomes "High". The operation in the period of t<t1 is the same as that in the case of writing of data 1. In the period of t1<t<t2, the written data transmission circuit 522 outputs level "High", and WDATAX becomes level "High". In the period of t2<t<t3, WENX is set to level "Low" to turn on the PMOS transistor 521. In response thereto, level "High" is transmitted to the drain terminal of the PMOS OTP element 500. In the period of t3<t<t4, the write voltage VPP level is applied to the VDD terminal. A potential difference between the drain and source of the PMOS OTP element 500, however, 0 V, and thus data 1 is not written. When data 1 is written, the PMOS OTP element 500 becomes a conductive state. In other words, the PMOS OTP element 500 remains in a non-conductive state, and hence maintains data 0.

(Reading of Data 1 from OTP Element)

FIG. 7A shows a timing chart of the respective signals in the case of reading data 1 from the PMOS OTP element 500. When a read mode is set, the read mode signal φ1 becomes "High". In the period of t<t1, the gate terminal RENX of the PMOS transistor 511 is level "High", the gate terminal CLR of the NMOS transistor 512 is level "Low", the gate terminal WENX of the PMOS transistor 521 is level "High", and the gate terminal MEMX of the PMOS transistor 530 is level "High", and hence the respective switches are all turned off. The potential of the data output terminal DOUT is at the level of previous read data held by the latch 513. In the period of t1<t<t2, CLR is set to level "High" to turn on the NMOS transistor 512, to thereby set the data output terminal DOUT to level "Low". In the period of t2<t<t3, CLR is set to level "Low" to turn off the NMOS transistor 512, but the data output terminal DOUT still maintains level "Low" due to the operation of the latch 513. In the period of t3<t<t4, RENX is set to level "Low" and MEMX is set to level "Low" to turn on the PMOS transistor 511 and the PMOS transistor 530. In this case, the PMOS OTP element 500 is in the conductive state (data 1 is stored), and hence the data output terminal DOUT is pulled up to level "High". In the period of t>t4, RENX is set to level "High" and MEMX is set to level "High" to turn off the PMOS transistor 511 and the PMOS transistor 530, but the data output terminal DOUT still maintains level "High" due to the operation of the latch 513. Through the operation described above, data 1 is read.

(Reading of Data 0 from OTP Element)

FIG. 7B shows a timing chart of the respective signals in the case of reading data 0 from the PMOS OTP element 500. When the read mode is set, the read mode signal φ1 becomes "High". The operation in the period of t<t3 is the same as that in the case of reading of data 1. In the period of t3<t<t4, RENX is set to level "Low" and MEMX is set to level "Low" to turn on the PMOS transistor 511 and the PMOS transistor 530. In this case, the PMOS OTP element 500 is in the non-conductive state (data 0 is stored), and hence the data output terminal DOUT cannot be pulled up to level "High" but remains level "Low". In the period of t>t4, RENX is set to level "High" and MEMX is set to level "High" to turn off the PMOS transistor 511 and the PMOS transistor 530, but the data output terminal DOUT still maintains level "Low" due to the operation of the latch 513. Through the operation described above, data 0 is read (see, for example, Japanese Patent Application Laid-open No. 2010-192039).

Examples of use of the circuit of FIG. 5 include the application of trimming for a voltage value of a constant voltage circuit as illustrated in FIG. 8. The constant voltage circuit includes a reference voltage circuit 801, an amplifier 802, an output transistor 803, and a resistor circuit 804 including a trimming circuit. Data output terminals DOUT1 to DOUTn of a plurality of the non-volatile memory element data write/read circuits illustrated in FIG. 5 are connected to input terminals of the resistor circuit 804 of FIG. 8. Initial measurement is performed before trimming. Then, a trimming amount is determined by a calculating formula based on the result of the measurement, and data is written into the non-volatile memory element.

In the related-art non-volatile memory element data write/read circuit, however, in the case where trimming for the constant voltage circuit or the like is performed by using data of the non-volatile memory element, there is a problem in that the accuracy of trimming is poor because of fluctuations in resistor circuit ratio and fluctuations in peripheral circuits.

SUMMARY OF THE INVENTION

The present invention has been devised in order to solve the problem described above, and achieves a non-volatile memory element data write/read circuit capable of improving the accuracy of trimming by creating a written state before data is written into a non-volatile memory element, with the addition of a minimum necessary element.

In order to solve the conventional problem, a non-volatile memory element data write/read circuit according to one embodiment of the present invention is configured as follows.

The non-volatile memory element data write/read circuit includes: a latch circuit connected to a data output terminal; a written data transmission circuit for outputting written data to a non-volatile memory element; a first switch connected between the non-volatile memory element and the data output terminal; a second switch connected between the data output terminal and a low voltage side power supply terminal; a third switch connected to an output terminal of the written data transmission circuit; a fourth switch connected between the non-volatile memory element and a high voltage side power supply terminal; and a control circuit for controlling the first switch, the second switch, the third switch, and the fourth switch. The control circuit is configured to, when a test mode signal is input to a test terminal, turn on the first switch and the third switch and turn off the second switch and the fourth switch so as to output the written data of the written data transmission circuit to the data output terminal.

According to one embodiment of the present invention, a written state can be created before writing into the non-volatile memory element is performed, with the addition of a minimum necessary element. Besides, by applying the non-volatile memory element data write/read circuit to a trimming data memory circuit for a trimming circuit, highly-accurate trimming can be achieved.

BRIEF DESCRIPTION OF THE DRAWINGS

In the accompanying drawings.

DETAILED DESCRIPTION OF THE PREFERRED EMBODIMENTS

Embodiments of the present invention are described below with reference to the accompanying drawings.

First Embodiment

Figure 1:
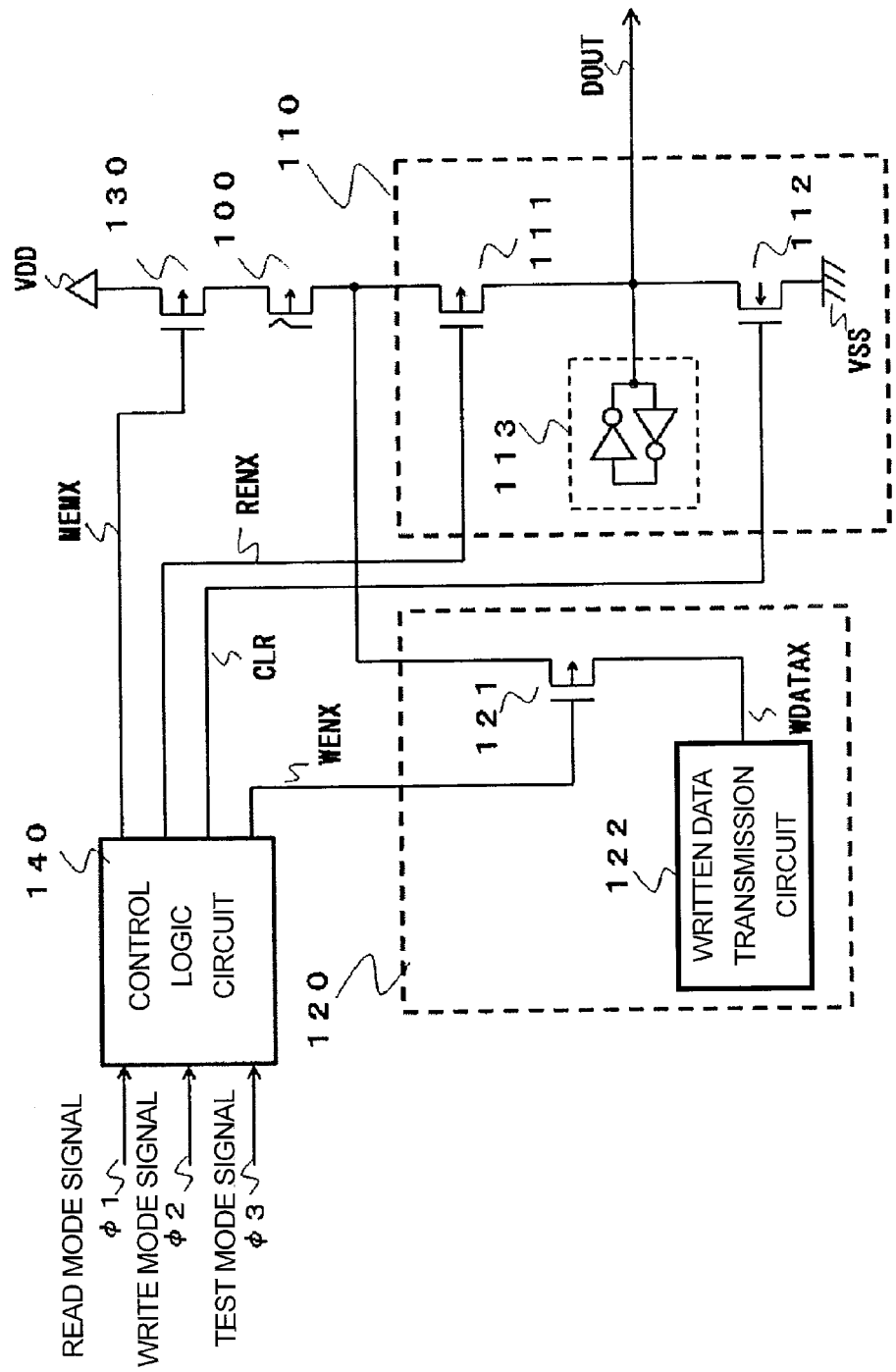
FIG. 1 is a diagram illustrating a non-volatile memory element data write/read circuit according to a first embodiment of the present invention.

FIG. 1 illustrates a circuit diagram of a non-volatile memory element data write/read circuit according to a first embodiment of the present invention. First, a description is given of circuit components and their connections. The non-volatile memory element data write/read circuit includes a PMOS one-time programming (OTP) element 100 as an example of a non-volatile memory element. The PMOS OTP element 100 has a source terminal connected to a drain terminal of a PMOS transistor 130. The PMOS transistor 130 has a source terminal connected to a high voltage side power supply terminal VDD. A read circuit 110 includes a PMOS transistor 111, an NMOS transistor 112, and a latch 113. A data output terminal DOUT is connected to an input/output terminal of the latch 113, a drain terminal of the PMOS transistor 111, and a drain terminal of the NMOS transistor 112. The NMOS transistor 112 has a source terminal connected to a low voltage side power supply terminal VSS. The PMOS transistor 111 has a source terminal connected to a drain terminal of the PMOS OTP element 100. A write circuit 120 includes a PMOS transistor 121 and a written data transmission circuit 122. The written data transmission circuit 122 has an output terminal WDATAX connected to a drain terminal of the PMOS transistor 121. The PMOS transistor 121 has a source terminal connected to the drain terminal of the PMOS OTP element 100. A control logic circuit 140 outputs a signal RENX, a signal WENX, a signal MEMX, and a signal CLR to a gate terminal of the PMOS transistor 111, a gate terminal of the PMOS transistor 121, a gate terminal of the PMOS transistor 130, and a gate terminal of the NMOS transistor 112, respectively, in accordance with a read mode signal φ1, a write mode signal φ2, and a test mode signal φ3 to be set.

Next, a description is given of the operation of the non-volatile memory element data write/read circuit according to the first embodiment.

(Transmission of Data 1 to Data Output Terminal)

Figure 2A:
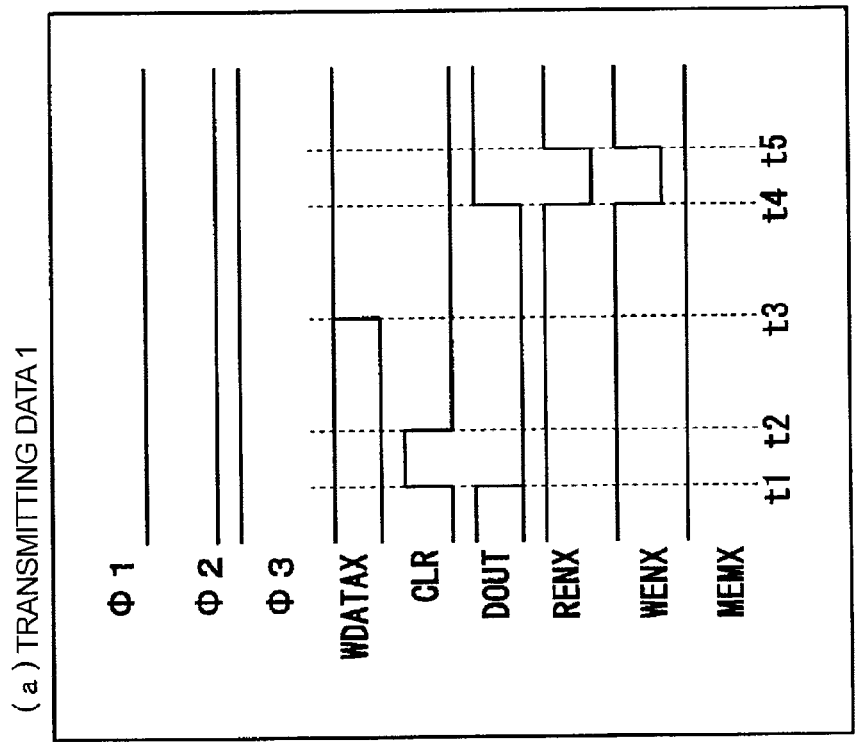
FIGS. 2A and 2B are timing charts showing data transmission operation according to the first embodiment of the present invention.

FIG. 2A shows a timing chart of operation of transmitting data 1 to the data output terminal DOUT. When a test mode is set, the test mode signal φ3 becomes "High". In a period of t<t1, the gate terminal RENX of the PMOS transistor 111 is level "High", the gate terminal CLR of the NMOS transistor 112 is level "Low", the gate terminal WENX of the PMOS transistor 121 is level "High", and the gate terminal MEMX of the PMOS transistor 130 is level "High", and hence the respective switches are all turned off. The output of the written data transmission circuit 122 is indefinite. The data output terminal DOUT is indefinite, but is fixed to one of levels "High" and "Low" held by the latch.

In a period of t1<t<t2, CLR is set to level "High" to turn on the NMOS transistor 112, to thereby set the data output terminal DOUT to level "Low". In a period of t2<t<t3, CLR is set to level "Low" to turn off the NMOS transistor 112, but the data output terminal DOUT still maintains level "Low" due to the operation of the latch 113. In a period of t3<t<t4, the written data transmission circuit 122 outputs level "High", and WDATAX becomes level "High".

In a period of t4<t<t5, RENX and WENX are set to level "Low" to turn on the PMOS transistor 111 and the PMOS transistor 121, and hence level "High" of WDATAX is transmitted to the data output terminal DOUT. In a period of t>t5, RENX and WENX are set to level "High" to turn off the PMOS transistor 111 and the PMOS transistor 121, but the data output terminal DOUT still maintains level "High" due to the operation of the latch 113. Through the operation described above, data 1 can be transmitted to the data output terminal DOUT without writing data into the non-volatile memory element.

(Transmission of Data 0 to Data Output Terminal)

Figure 2B:
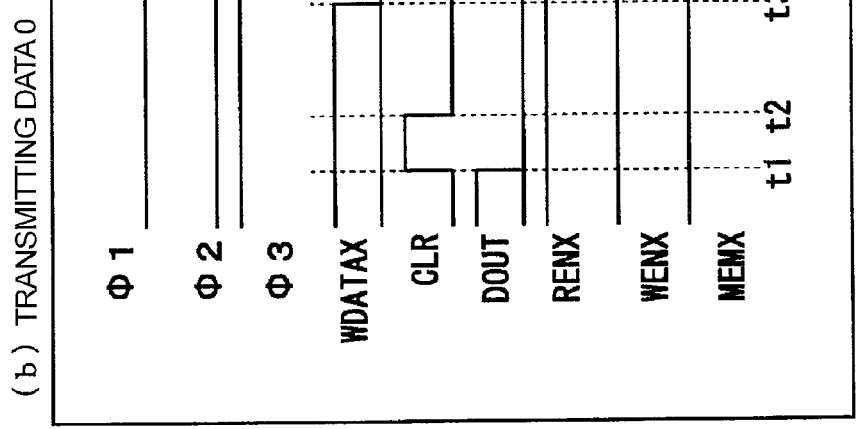

FIG. 2B shows a timing chart of operation of transmitting data 0 to the data output terminal DOUT. When the test mode is set, the test mode signal φ3 becomes "High". The operation in the period of t<t3 is the same as that in the case of preliminary transmission of data 1. In the period of t3<t<t4, the written data transmission circuit 122 outputs level "Low", and WDATAX becomes level "Low".

In the period of t4<t<t5, RENX and WENX are set to level "Low". However, because WDATAX is level "Low", the PMOS transistors 111 and 121 do not become the ON state. Accordingly, the data output terminal DOUT remains level "Low". In the period of t>t5, RENX and WENX are set to level "High" to turn off the PMOS transistor 111 and the PMOS transistor 121, but the data output terminal DOUT still maintains level "Low" due to the operation of the latch 113.

In this way, data 0 can be transmitted to the data output terminal DOUT without writing data into the non-volatile memory element. Then, this data can be used to create a written state in a trimming circuit before writing into the non-volatile memory element, and it can be determined whether the trimming amount is proper or not through measurement of electrical characteristics after trimming. When the trimming amount is improper, corrected data is actually written, to thereby achieve highly-accurate trimming.

The present invention is not limited to those examples of the embodiment, and can be embodied in various ways within the range not departing from the gist of the present invention.

As described above, the non-volatile memory element data write/read circuit according to the first embodiment is capable of transmitting data 0 to the data output terminal DOUT without writing data into the non-volatile memory element. Then, the state in which data is written into the non-volatile memory element can be created in the trimming circuit, and it can be determined whether the trimming amount is proper or not through measurement of electrical characteristics. When the trimming amount is improper, corrected data is actually written, to thereby achieve highly-accurate trimming.

Second Embodiment

Figure 3:
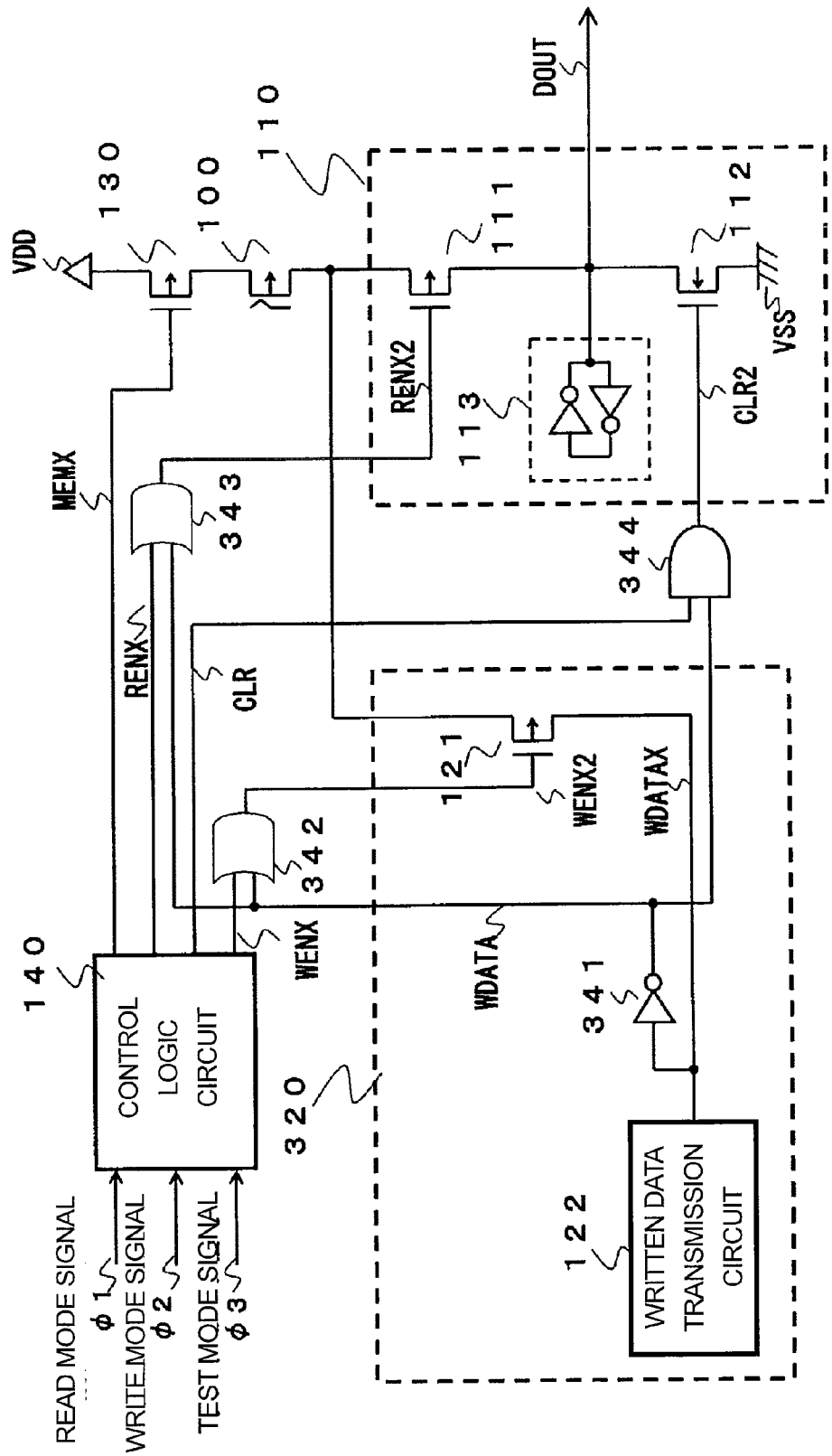
FIG. 3 is a diagram illustrating a non-volatile memory element data write/read circuit according to a second embodiment of the present invention.

FIG. 3 illustrates a circuit diagram of a non-volatile memory element data write/read circuit according to a second embodiment of the present invention. First, a description is given of how the circuit components and their connections are changed from FIG. 1. A write circuit 320 inputs the output signal WDATAX of the written data transmission circuit 122 to an inverter 341, which is then output as WDATA. An OR gate 343 inputs RENX and WDATA. A PMOS transistor 311 has a gate terminal connected to an output signal RENX2 of the OR gate 343. An OR gate 342 inputs WENX and WDATA. A PMOS transistor 321 has a gate terminal connected to an output signal WENX2 of the OR gate 342. An AND gate 344 inputs CLR and WDATA. An NMOS transistor 312 has a gate terminal connected to an output signal CLR2 of the AND gate 344.

Next, a description is given of the operation of the non-volatile memory element data write/read circuit according to the second embodiment.

(Transmission of Data 1 to Data Output Terminal)

Figure 4A:
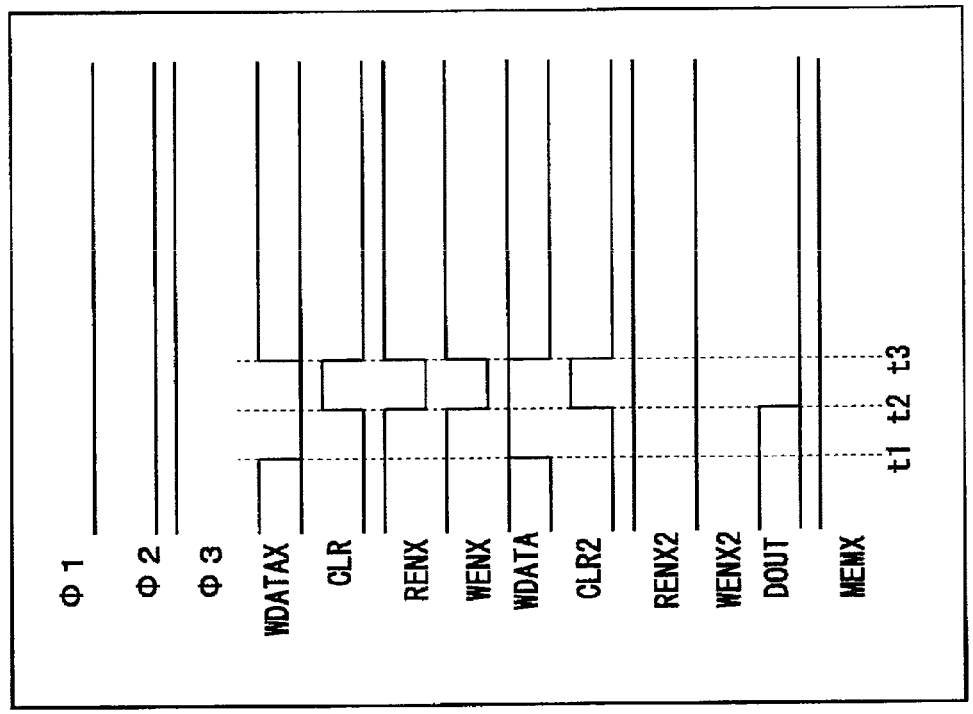
FIGS. 4A and 4B are timing charts showing data transmission operation according to the second embodiment of the present invention.

FIG. 4A shows a timing chart of operation of transmitting data 1 to the data output terminal DOUT. When a test mode is set, the test mode signal φ3 becomes "High". In a period of t<t1, the gate terminal RENX2 of the PMOS transistor 311 is level "High", the gate terminal CLR2 of the NMOS transistor 312 is level "Low", the gate terminal WENX2 of the PMOS transistor 321 is level "High", and the gate terminal MEMX of the PMOS transistor 330 is level "High", and hence the respective switches are all turned off. The output of the written data transmission circuit 122 is indefinite. The data output terminal DOUT is indefinite, but is fixed to one of levels "High" and "Low" held by the latch.

In a period of t1<t<t2, WDATAX is set to level "High". WDATA is set to level "Low" due to the operation of the inverter 341. In a period of t2<t<t3, CLR is set to level "High", and RENX and WENX are set to level "Low". In this case, due to the operations of the OR gates 342 and 343, signals of the same logics as RENX and WENX are output to RENX2 and WENX2, respectively, but CLR2 remains level "Low" due to the operation of the AND gate 344.

Accordingly, only the PMOS transistors 311 and 321 are turned on, and hence level "High" of WDATAX is transmitted to the data output terminal DOUT. In the period of t>t3, CLR is set to level "Low", RENX and WENX are set to level "High", and RENX2 and WENX2 are set to level "High", but level "High" of the data output terminal DOUT is held by the operation of the latch 113. The data of WDATAX may be indefinite. Through the operation described above, data 1 can be transmitted to the data output terminal DOUT without writing data into the non-volatile memory element.

(Transmission of Data 0 to Data Output Terminal)

Figure 4B:
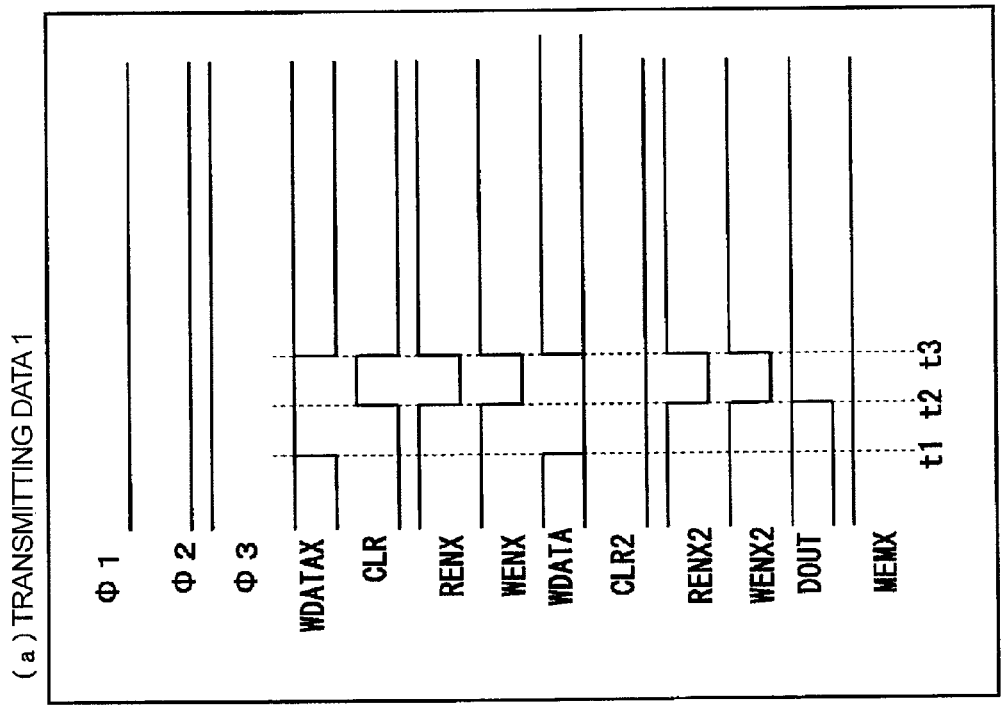
Figure 5:
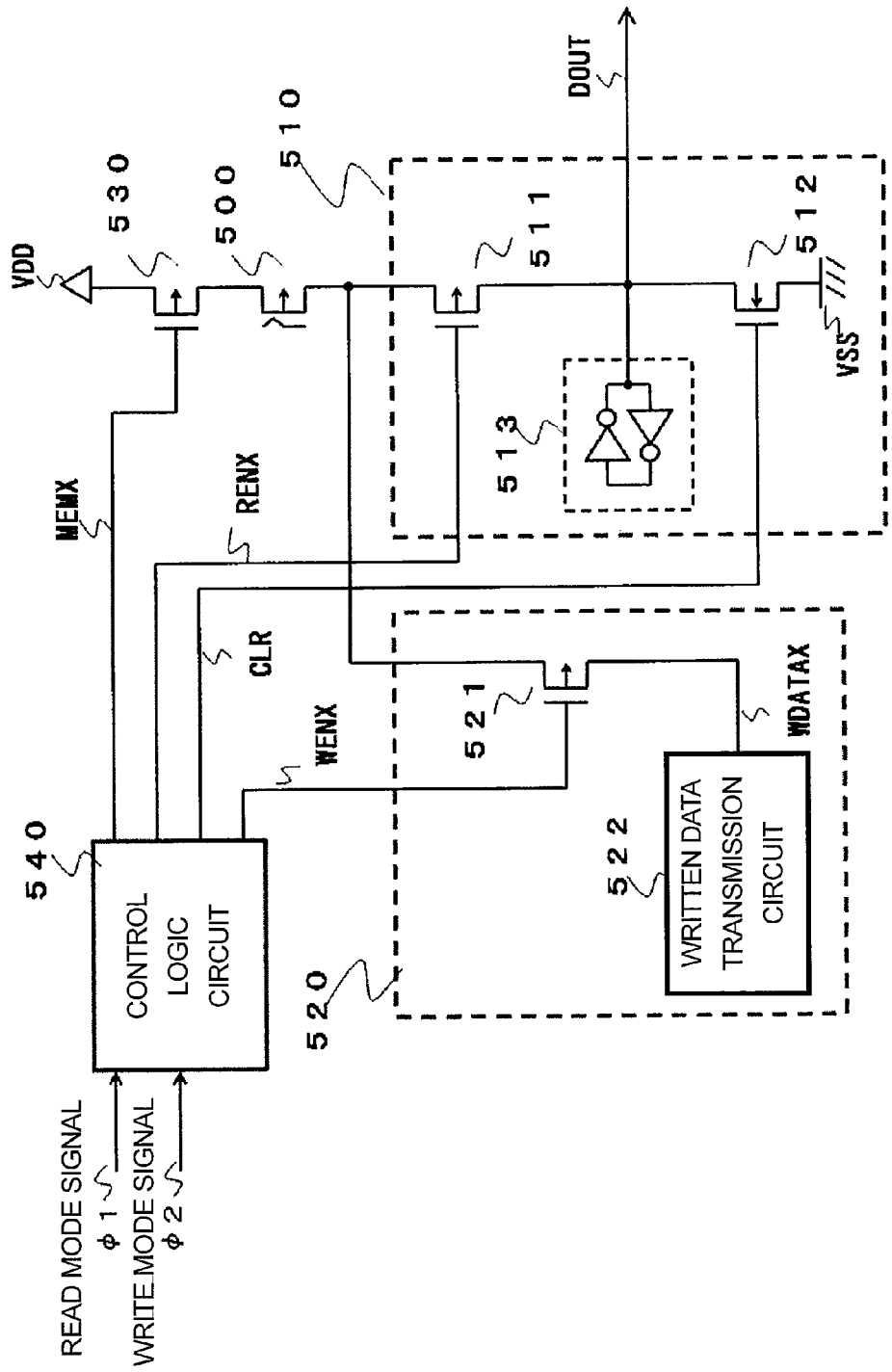
FIG. 5 is a diagram illustrating a related-art non-volatile memory element data write/read circuit.
Figures 6A, 6B:
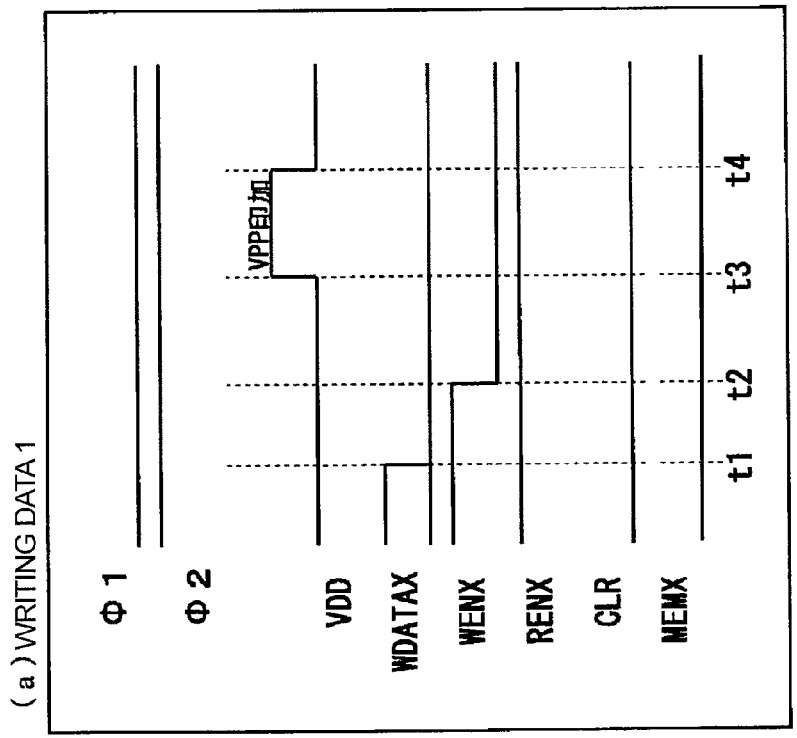
FIGS. 6A and 6B are timing charts showing writing of data into the related-art non-volatile memory element.
Figure 7A:
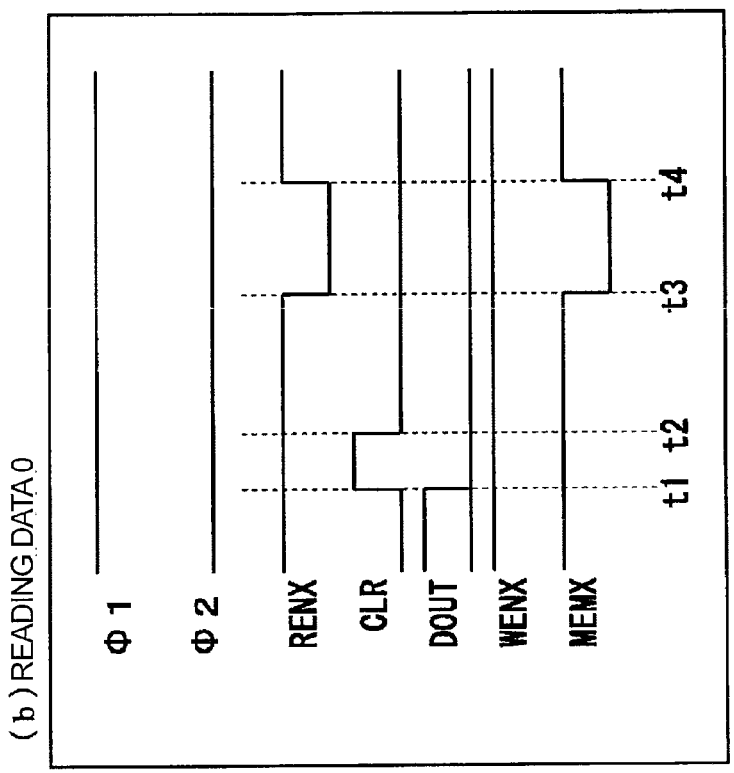
FIGS. 7A and 7B are timing charts showing reading of data from the related-art non-volatile memory element.
Figure 7B:
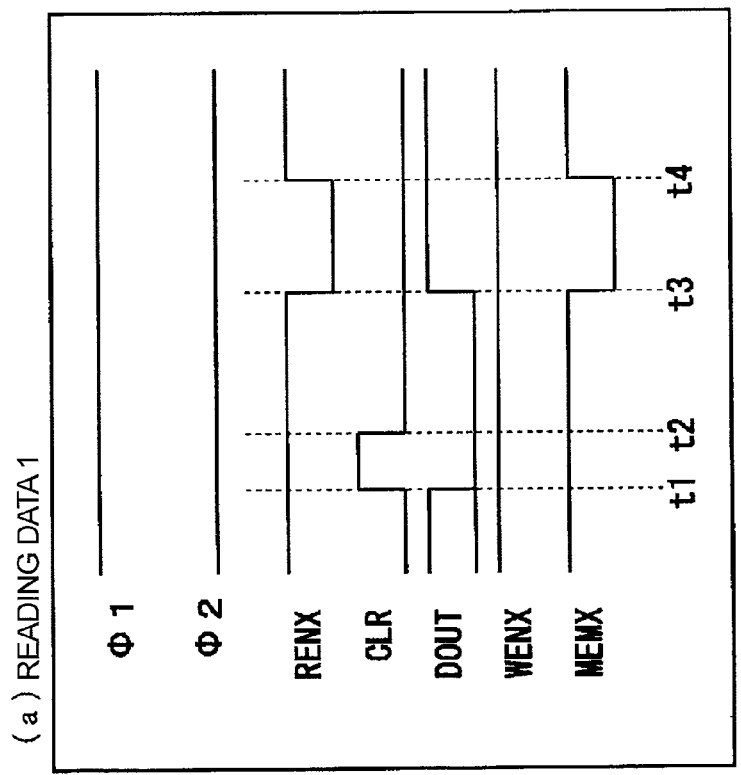

FIG. 4B shows a timing chart of operation of transmitting data 0 to the data output terminal. The operation in the period of t<t1 is the same as that in the case of transmission of data 1. In the period of t1<t<t2, WDATAX is set to level "Low". WDATA is set to level "High" due to the operation of the inverter 341.

In the period of t2<t<t3, CLR is set to level "High", and RENX and WENX are set to level "Low". In this case, due to the operation of the AND gate 344, a signal of the same logic as CLR is output to CLR2, but RENX2 and WENX2 remain level "High" due to the operations of the OR gates 342 and 343. Accordingly, the NMOS transistor 312 is turned on, and hence level "Low" of WDATAX is transmitted to the data output terminal DOUT via the NMOS transistor 312.

In the period of t>t3, CLR is set to level "Low", RENX and WENX are set to level "High", and CLR2 is set to level "Low", but level "Low" of the data output terminal DOUT is held by the operation of the latch 113. The data of WDATAX may be indefinite. Through the operation described above, data 0 can be transmitted to the data output terminal DOUT without writing data into the non-volatile memory element.

In this way, data 0 can be transmitted to the data output terminal DOUT without writing data into the non-volatile memory element. Then, this data can be used to create a written state in a trimming circuit before writing into the non-volatile memory element, and it can be determined whether the trimming amount is proper or not through measurement of electrical characteristics after trimming. When the trimming amount is improper, corrected data is actually written, to thereby achieve highly-accurate trimming. Besides, it is unnecessary to clear the latch 113, and hence a transmission time of data can be shortened.

The present invention is not limited to those examples of the embodiment, and can be embodied in various ways within the range not departing from the gist of the present invention.

As described above, the non-volatile memory element data write/read circuit according to the second embodiment is capable of transmitting data 0 to the data output terminal DOUT without writing data into the non-volatile memory element. Then, the state in which data is written into the non-volatile memory element can be created in the trimming circuit, and it can be determined whether the trimming amount is proper or not through measurement of electrical characteristics. When the trimming amount is improper, corrected data is actually written, to thereby achieve highly-accurate trimming. Besides, the transmission time of data can be shortened as well.

Figure 8:
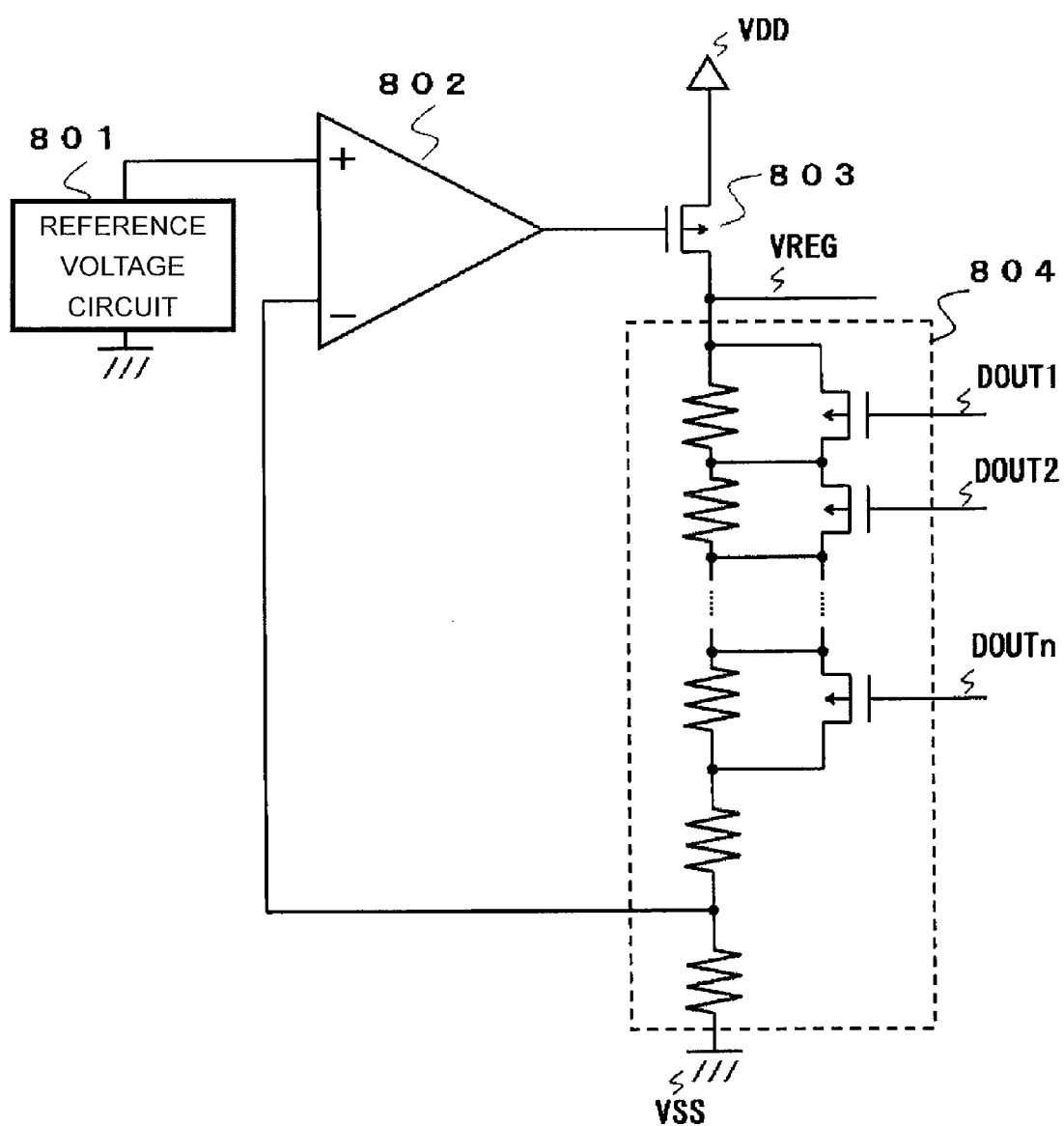
FIG. 8 is a circuit diagram illustrating a constant voltage circuit including a trimming circuit.

Note that, when the semiconductor non-volatile memory device according to the present invention is applied to a trimming data memory circuit for a trimming circuit illustrated in FIG. 8, a trimmed state can be created before writing into the non-volatile memory element. Consequently, it can be determined before trimming whether the trimming amount is proper or not through measurement of electric characteristics, and hence highly-accurate trimming can be achieved.

What is claimed is:

1. A non-volatile semiconductor memory device, comprising:
   a non-volatile memory element;
   a data output terminal for outputting data of the non-volatile memory element;
   a latch circuit for holding the data connected to the data output terminal;
   a written data transmission circuit for outputting written data to the non-volatile memory element;
   a first switch connected between the non-volatile memory element and the data output terminal;
   a second switch connected between the data output terminal and a low voltage side power supply terminal;
   a third switch connected to an output terminal of the written data transmission circuit;
   a fourth switch connected between the non-volatile memory element and a high voltage side power supply terminal; and
   a control circuit for controlling the first switch, the second switch, the third switch, and the fourth switch,
   the control circuit comprising a test terminal,
   the control circuit being configured to, when a test mode signal is input to the test terminal, turn on the first switch by a first control signal, turn off the second switch by a second control signal, turn on the third switch by a third control signal, and turn off the fourth switch by a fourth control signal, to control the written data of the written data transmission circuit to be output to the data output terminal.

2. A non-volatile semiconductor memory device according to claim 1, wherein:
   the first switch is controlled by a signal based on the first control signal and the written data;
   the second switch is controlled by a signal based on the second control signal and the written data; and
   the third switch is controlled by a signal based on the third control signal and the written data.

3. A semiconductor device, comprising a trimming data memory circuit,
   the trimming data memory circuit comprising the non-volatile semiconductor memory device according to claim 1.

\* \* \* \* \*